(12) United States Patent
Liu et al.

(10) Patent No.: US 11,664,194 B2
(45) Date of Patent: May 30, 2023

(54) PROCEDURAL ELECTRON BEAM LITHOGRAPHY

(71) Applicant: Magic Leap, Inc., Plantation, FL (US)

(72) Inventors: Victor Kai Liu, Mountain View, CA (US); Mauro Melli, San Leandro, CA (US)

(73) Assignee: MAGIC LEAP, INC., Plantation, FL (US)

( * ) Notice: Subject to any disclaimer, the term of this patent is extended or adjusted under 35 U.S.C. 154(b) by 90 days.

(21) Appl. No.: 17/183,090

(22) Filed: Feb. 23, 2021

(65) Prior Publication Data
US 2021/0265132 A1 Aug. 26, 2021

Related U.S. Application Data

(60) Provisional application No. 62/981,756, filed on Feb. 26, 2020.

(51) Int. Cl.
*H01J 37/317* (2006.01)
*H01J 37/302* (2006.01)

(52) U.S. Cl.
CPC ...... *H01J 37/3174* (2013.01); *H01J 37/3026* (2013.01)

(58) Field of Classification Search
CPC .............. H01J 37/3023; H01J 37/3175; H01J 37/3026; H01J 37/3174
See application file for complete search history.

(56) References Cited

U.S. PATENT DOCUMENTS

| | | | |
|---|---|---|---|
| 6,850,221 B1 | 2/2005 | Tickle | |
| 8,975,601 B1 * | 3/2015 | Chen | H01J 37/3026 250/397 |
| 10,534,115 B1 * | 1/2020 | Calafiore | G02B 5/1857 |
| 2006/0028436 A1 | 2/2006 | Armstrong | |
| 2007/0081123 A1 | 4/2007 | Lewis | |
| 2012/0127062 A1 | 5/2012 | Bar-Zeev et al. | |
| 2012/0162549 A1 | 6/2012 | Gao et al. | |
| 2013/0082922 A1 | 4/2013 | Miller | |
| 2013/0117377 A1 | 5/2013 | Miller | |

(Continued)

FOREIGN PATENT DOCUMENTS

WO WO 2019/224176 11/2019

OTHER PUBLICATIONS

International Search Report and Written Opinion for PCT Application No. PCT/US 21/19261, dated May 3, 2021.
ARToolKit: https://web.archive.org/web/20051013062315/http://www.hitl.washington.edu:80/artoolkit/documentation/hardware.htm, archived Oct. 13, 2005.
Azuma, "A Survey of Augmented Reality," Teleoperators and Virtual Environments 6, (Aug. 4, 1997), pp. 355-385. https://web.archive.org/web/20010604100006/http://www.cs.unc.edu/~azuma/ARpresence.pdf.

(Continued)

*Primary Examiner* — Eliza W Osenbaugh-Stewart
(74) *Attorney, Agent, or Firm* — Seed IP Law Group LLP

(57) ABSTRACT

A Procedural EBL system implements a user-provided oracle function (e.g., associated with a specific pattern) to generate control instructions for electron beam drive electronics in an on-demand basis. A control system may invoke the oracle function to query the pattern at individual point locations (e.g., individual x,y locations), and/or it may query the pattern over an area corresponding to a current field being addressed by the beam and stage positioner, for example. This Procedural EBL configuration manages control and pattern generation so that the low-level drive electronics and beam column may remain unchanged, allowing it to leverage existing EBL technologies.

13 Claims, 8 Drawing Sheets

(56) References Cited

U.S. PATENT DOCUMENTS

| | | |
|---|---|---|
| 2013/0125027 A1 | 5/2013 | Abovitz |
| 2013/0208234 A1 | 8/2013 | Lewis |
| 2013/0242262 A1 | 9/2013 | Lewis |
| 2014/0071539 A1 | 3/2014 | Gao |
| 2014/0177023 A1 | 6/2014 | Gao et al. |
| 2014/0218468 A1 | 8/2014 | Gao et al. |
| 2014/0267420 A1 | 9/2014 | Schowengerdt |
| 2015/0016777 A1 | 1/2015 | Abovitz et al. |
| 2015/0103306 A1 | 4/2015 | Kaji et al. |
| 2015/0178939 A1 | 6/2015 | Bradski et al. |
| 2015/0205126 A1 | 7/2015 | Schowengerdt |
| 2015/0309263 A2 | 10/2015 | Abovitz et al. |
| 2015/0326570 A1 | 11/2015 | Publicover et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2018/0090299 A1* | 3/2018 | Nakayamada ...... H01J 37/3174 |
| 2018/0210353 A1 | 7/2018 | Nishimura et al. |

OTHER PUBLICATIONS

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

PROCEDURAL ELECTRON BEAM LITHOGRAPHY

CROSS-REFERENCE TO RELATED APPLICATION

This application claims benefit of priority under 35 U.S.C 119(e) to U.S. Provisional Patent Application No. 62/981,756 filed Feb. 26, 2020, entitled "PROCEDURAL ELECTRON BEAM LITHOGRAPHY".

TECHNICAL FIELD

The present disclosure relates to automated lithography.

BACKGROUND

Existing software interfaces to electron beam lithography systems require a user to provide a monolithic top-down specification of the entire layout, for example in the form of a GDS or OASIS file. The maturing field of designer metasurfaces involves very large area layouts that can involve completely non-periodic and non-Manhattan geometry. However, these layouts are difficult to use, e.g., because of their large size and time spent on design and layout.

SUMMARY

Despite this apparent lack of symmetry, almost all practically interesting layouts can be represented by mathematical expressions. Thus, described herein is a procedural electron beam lithography (PEBL), which requests pattern generator fields on-the-fly from a user-provided script. A control system may then compute the local exposure settings from the relevant underlying mathematical expression. This may reduce the complexity of layout data preparation by many orders of magnitude in terms of data size as well as time spent on design and layout. While this approach is discussed herein with reference to nano-optics, it is also applicable to other fields of user. For example, the systems and methods discussed herein may be used in designing large-scale holographic patterns, diffuser patterns for illumination design, antenna design for RF and Terahertz, and even classical IC design where sub-layouts are loaded dynamically instead of in one monolithic database.

In some implementations, the PEBL systems discussed herein is configured to break down, discretize, and execute patterns for diffractives in files that are terabyte, petabyte (or larger) size, which would crash existing EBL systems. For example, large pattern files (e.g., associated with non-regular, non-repeating, and/or non-rectilinear patterns) that existing EBL systems are not able to process may be processed by the PEBL system discussed herein. One example of a pattern associated with a large pattern file, and which may be processed by the PEBL system discussed herein, is a metasurface lens:

$$\varphi(x, y) = \frac{2\pi}{\lambda}\left(f - \sqrt{x^2 + y^2 + f^2}\right)$$

This example metasurface lens pattern may result in a pattern file that is about 100 Mb for a 1 mm lens and 500 Gb or more for a 50 mm lens. For event more complex patterns, file sizes may easily reach the terabyte or even petabyte size.

BRIEF DESCRIPTION OF THE DRAWINGS

The following drawings and the associated descriptions are provided to illustrate embodiments of the present disclosure and do not limit the scope of the claims. The relative placement of features and elements may have been modified for the purpose of illustrative clarity. Where practical, the same or similar reference numbers denote the same or similar or equivalent structures, features, aspects, or elements, in accordance with one or more embodiments.

The drawings illustrate the design and utility of various embodiments of the present disclosure. It should be noted that the figures are not necessarily drawn to scale and that elements of similar structures or functions are represented by like reference numerals throughout the figures. Understanding that these drawings depict only example embodiments of the disclosure and are not therefore to be considered limiting of its scope, the disclosure will be described and explained with additional specificity and detail through the use of the accompanying drawings in which.

DETAILED DESCRIPTION

Terms

To facilitate an understanding of the systems and methods discussed herein, several terms are described below. These terms, as well as other terms used herein, should be construed to include the provided descriptions, the ordinary and customary meanings of the terms, and/or any other implied meaning for the respective terms, wherein such construction is consistent with context of the term. Thus, the descriptions below do not limit the meaning of these terms, but only provide example descriptions.

Graphic Database System (GDS), Open Artwork System Interchange Standard (OASIS), and Manufacturing Electron Beam Exposure System (MEBES) are examples of languages used by computers to define patterns, typically that are associated with an integrated circuit manufacturing process. These languages define, for example, code requirements that define geometric shapes such as rectangles, trapezoids, and polygons, as well as the types of properties each can have. These file formats, and other similar file formats, allow exchange of integrated circuit layout data between vendors.

Metasurface: structures engineered to interact with light waves in ways that natural materials cannot. A metasurface may include layers that are a few billionths of a meter (nanometers) thick, and contain nanoscale optical features (e.g., antennas) that can control the reflection or transmission of light.

Example Electron Beam Lithography Workflow

Figure 1:
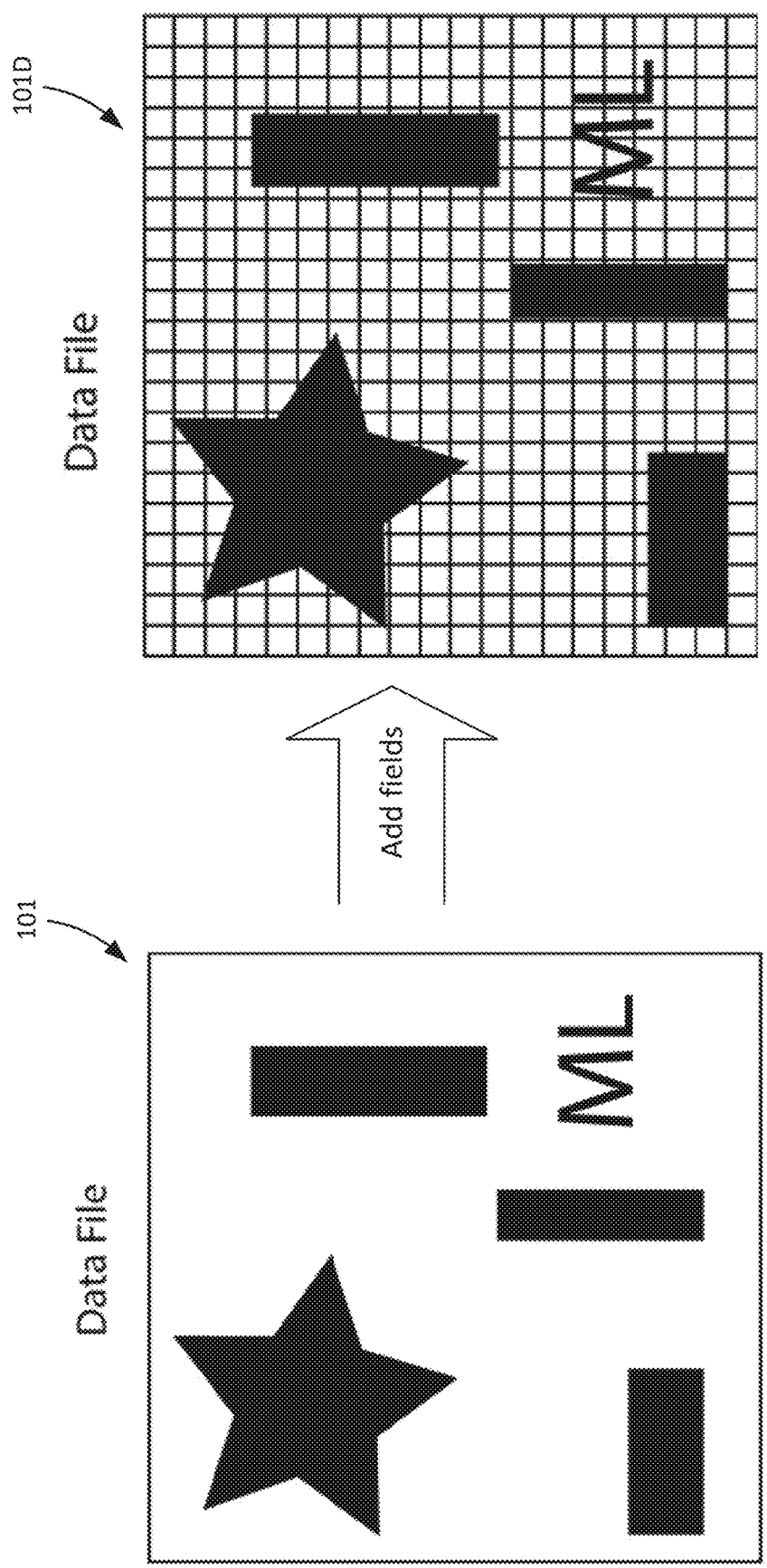
FIG. 1 is a diagram illustrating an example full pattern that has been divided into a divided pattern comprising a plurality of fields.

FIG. 1 is a diagram illustrating an example full pattern 101 that has been divided into fields (e.g., 20×20=400 fields in this example) illustrated in a divided pattern 101D.

Figure 2:
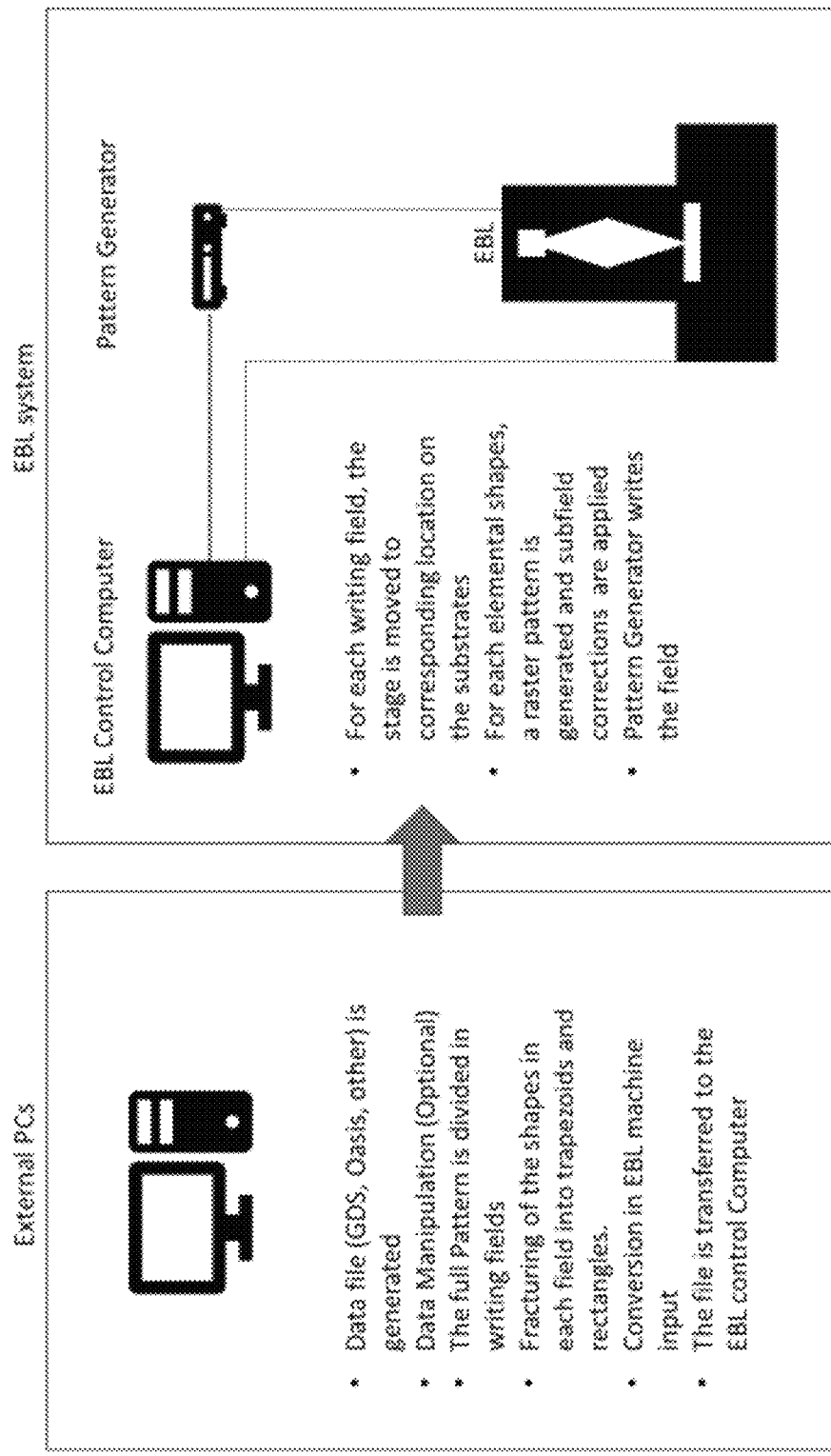
FIG. 2 is a high-level diagram illustrating a general workflow for patterning a wafer or a reticle mask using an electron beam lithography (EBL) system.

FIG. 2 is a high-level diagram illustrating a general workflow for patterning a wafer or a reticle mask using an electron beam lithography (EBL) system. As noted in FIG. 2, for example, the process may include:

- The user prepares a data file, such as GDS, containing polygons representing all areas of the entire wafer or reticle that should be exposed by the electron beam.
- The data file is processed and converted to a proprietary file format that is read by the low-level software driving the EBL system, in a process typically called fracturing. This process may be done by a third-party software (e.g., Synopsis CATS or GenlSys Beamer) or proprietary software. Data manipulation may include Booleans, proximity correction, scaling, healing and tone reversing.
- During the fracturing process, the pattern is divided in writing fields and in each individual writing field all the shapes are identified and fractured in rectangles or trapezoids and converted in proprietary exposure machine format output. FIG. 1 illustrates an example of a full pattern 101 that has been divided into fields (20×20=400 fields in this examples) illustrated in divided pattern 101D.
- The fractured data is sent to the EBL control computer. For example, for each field a vectorial raster pattern may be generated to cause movement of the stage to the field location on the wafer.
- The raster pattern is sent to the electronics driving the electron beam, and a beam blanking system may be used to write the entire pattern onto the wafer.

As noted above, layouts are becoming more complex, to the extent that they do not fit into core memory, and perhaps they will not fit onto hard drives or magnetic tapes.

Example Procedural Electron Beam Lithography

To address the technical shortcomings of existing lithography procedures, such as those noted above, a procedural electron beam lithography (PEBL), in which pattern data is procedurally generated, is described herein. This approach may be fully "backwards compatible" to the existing EBL workflow. In fact, in some implementations, PEBL may be a superset of the representational power of monolithic layouts.

Figure 3A:
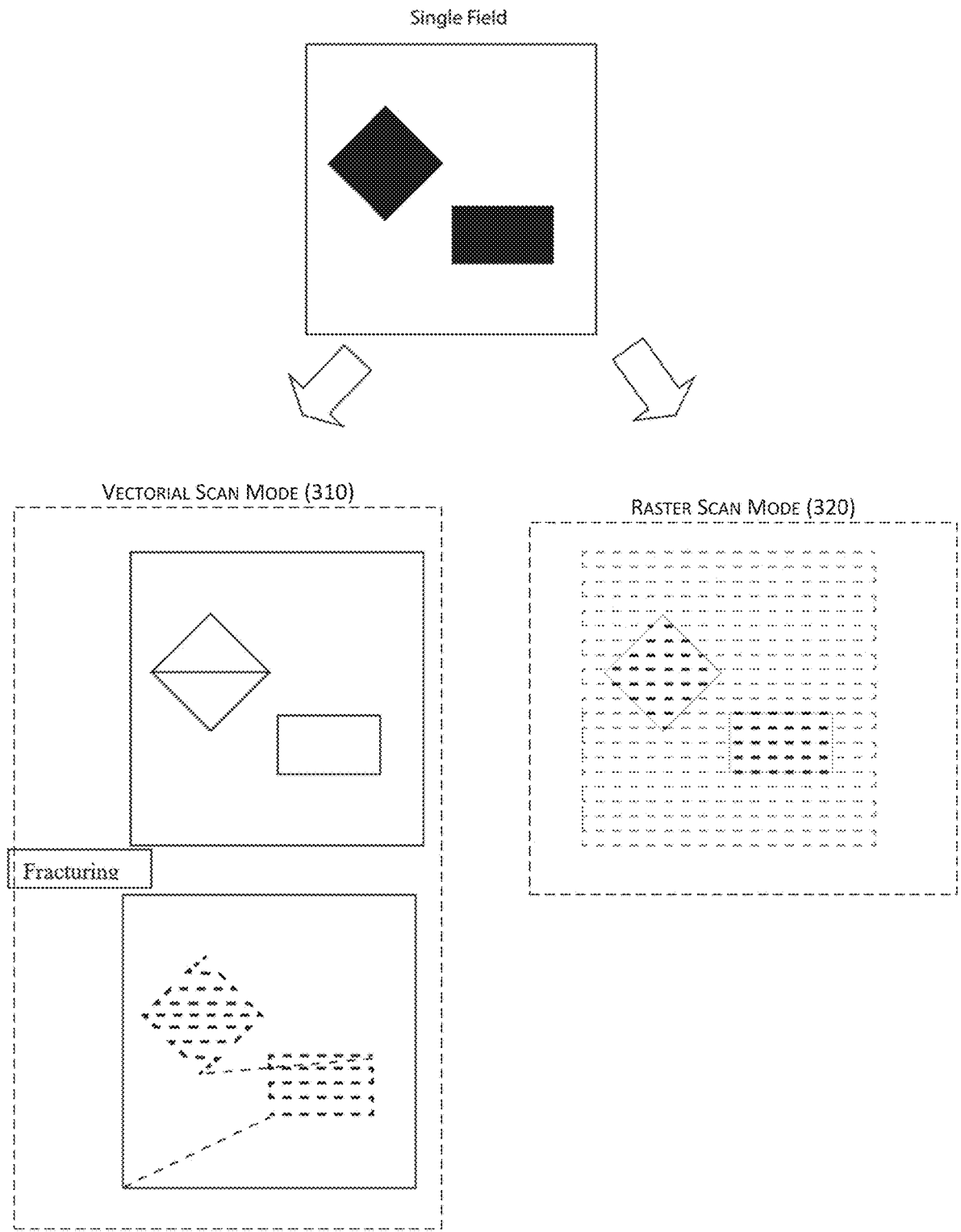
FIG. 3A illustrates the vectorial scan mode and raster scan mode that may be available in a PEBL system.

Depending on the scan mode, the PEBL may include at least two different implementations, raster scan mode or vectorial scan mode. For example, as illustrated in the block diagram of FIG. 3A, a vectorial scan mode 310 may include fracturing all of the shapes in the writing field (e.g., one of the 400 fields in the example of FIG. 2) into trapezoids or rectangles. These primitive shapes may then be written by moving the beams only in regions defined by the primitive shapes. Alternatively, in a raster scan mode 320, the beam is scanned in all the writing field and blanked in the region outside the pattern.

Each of these scan modes is discussed further below with reference to example implementations of PEBL. In either mode, the pattern can be defined by an available scripting language, e.g. Python, or by a dedicated one. In some implementations, the computational power to create the writing field at the speed of the writing may be improved with an additional dedicated computer (and/or processors or memory).

Raster Scan Mode

EBL systems may perform exposures one field at a time due to the limited beam travel. Therefore, the stage may be moved by an increment corresponding to the field size (e.g., on the order of 1 millimeter) and then held steady as the electron beam performs a raster scan. In the process of exposing an entire wafer, only data for the next field to be exposed is required at any given time. Therefore, the vast majority of the pattern data is not required at any given time, and the portion that is required for the upcoming field is used only once and discarded. Additionally, any desired modifications to the data local to within one field are typically performed ahead of time, operating on the entire layout.

Based on the previous observations, as discuss herein, a PEBL workflow may generate pattern data when it is required, to avoid the massive burden of storing it all at once as well as to simplify the representation. Existing data formats, whether it is Graphic Design System ("GDS" or GDSII), MEBES, Open Artwork System Interchange Standard ("OASIS"), or other proprietary formats, use a boundary representation in which exposed areas are represented by polygons.

Figure 3B:
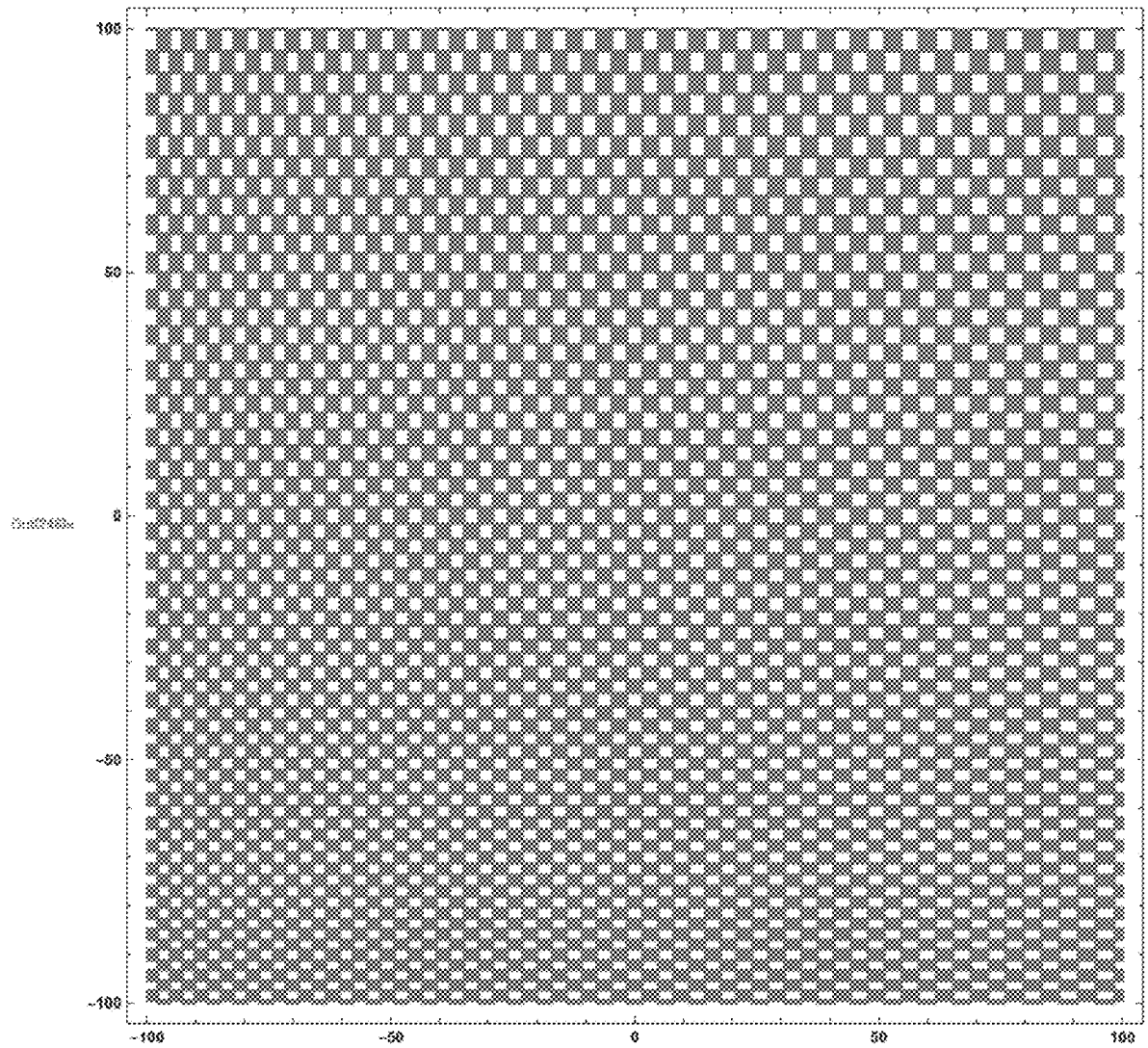
FIG. 3B is an example plot of a checkerboard grating.

An alternative representation is to provide an "oracle" function that takes as input the coordinates of a point on the wafer (or other substrate), and returns the exposure settings (e.g., blanking, beam current, etc.) that should be applied to the point in question. As a basic example of an oracle function, a checkerboard grating that is chirped in both directions, such as in the example plot of FIG. 3B, could be expressed in C code as:

```
Int oracle(double x, double y){
    double px = 1+1e-3*x;
    double py = 1+2e-3*y;
    return cos(x/px)*cos(y/py) > 0;
}
```

As noted elsewhere, oracle functions may be provided in various forms (e.g., programming languages) and may be of varying degrees of complexity, such as to perform functions that are much more complex than the example above.

Figure 3C:
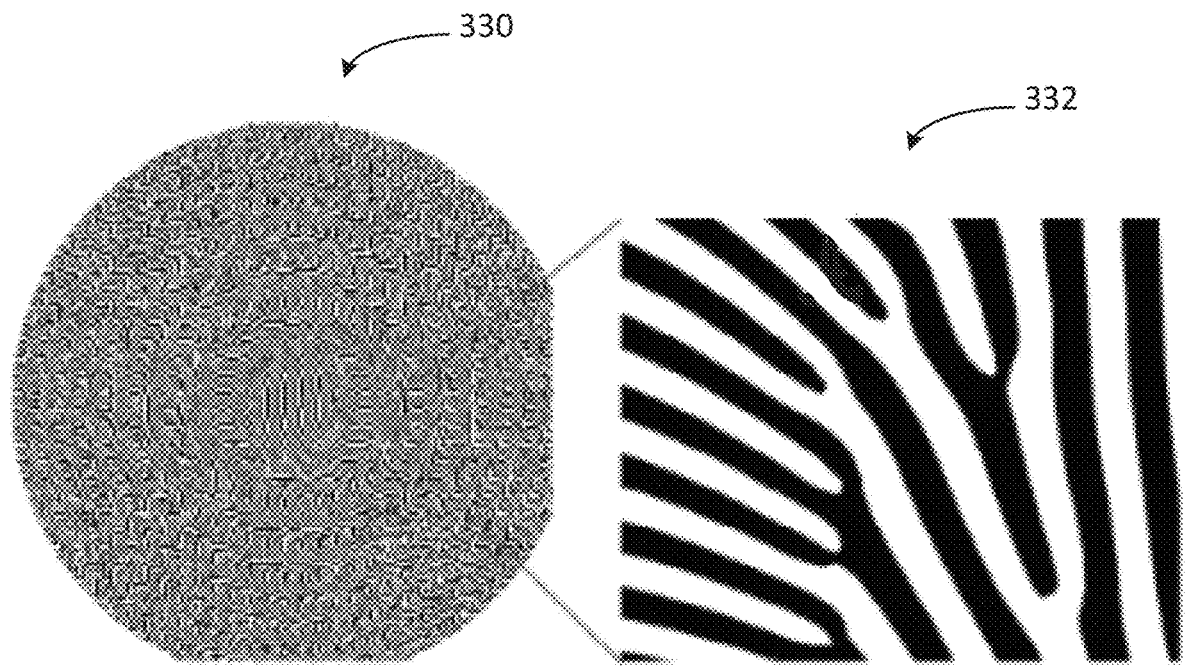
FIG. 3C illustrates an example pattern, and a field of the pattern.

FIG. 3C illustrates an example pattern 330, and a field 332 of the pattern 330. Through the elimination of data description and handling difficulties that may exist in typical EBL systems, the PEBL systems disclosed herein, such as those using an oracle function that calculates exposure settings for a particular field of a pattern in real-time (or even pre-calculates for some number of fields as discussed further below), allow structuring of the complex pattern using electron beam lithography. In contrast, existing EBL systems may provide high-resolution only in small areas, which may be rectilinear, with a requirement that elements are repeated as much as possible. These requirements are not necessary using the PEBL technology discussed herein.

Figure 4A:
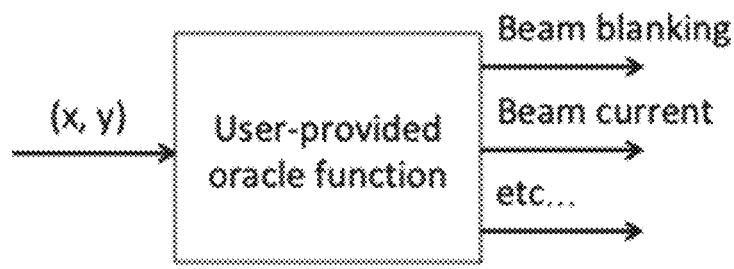
FIG. 4A illustrates, for example, an oracle function that receives a dimensional input (e.g., x, y) and outputs various control data, such as beam blanking, beam current, and/or other data to be used at that particular point on the wafer.

FIG. 4A illustrates, for example, an oracle function that receives a dimensional input (e.g., x, y) and outputs various control data, such as beam blanking, beam current, and/or other data to be used at that particular point on the wafer. By using an oracle, pattern data is generated on the fly (e.g., in real-time or substantially real-time), rather than generation of the totality of pattern data prior to beginning the EBL process. This on-the-fly generation of control data allows arbitrarily complex pattern data to be generated, one point at a time, or one field at a time, as part of the EBL process.

Figure 4B:
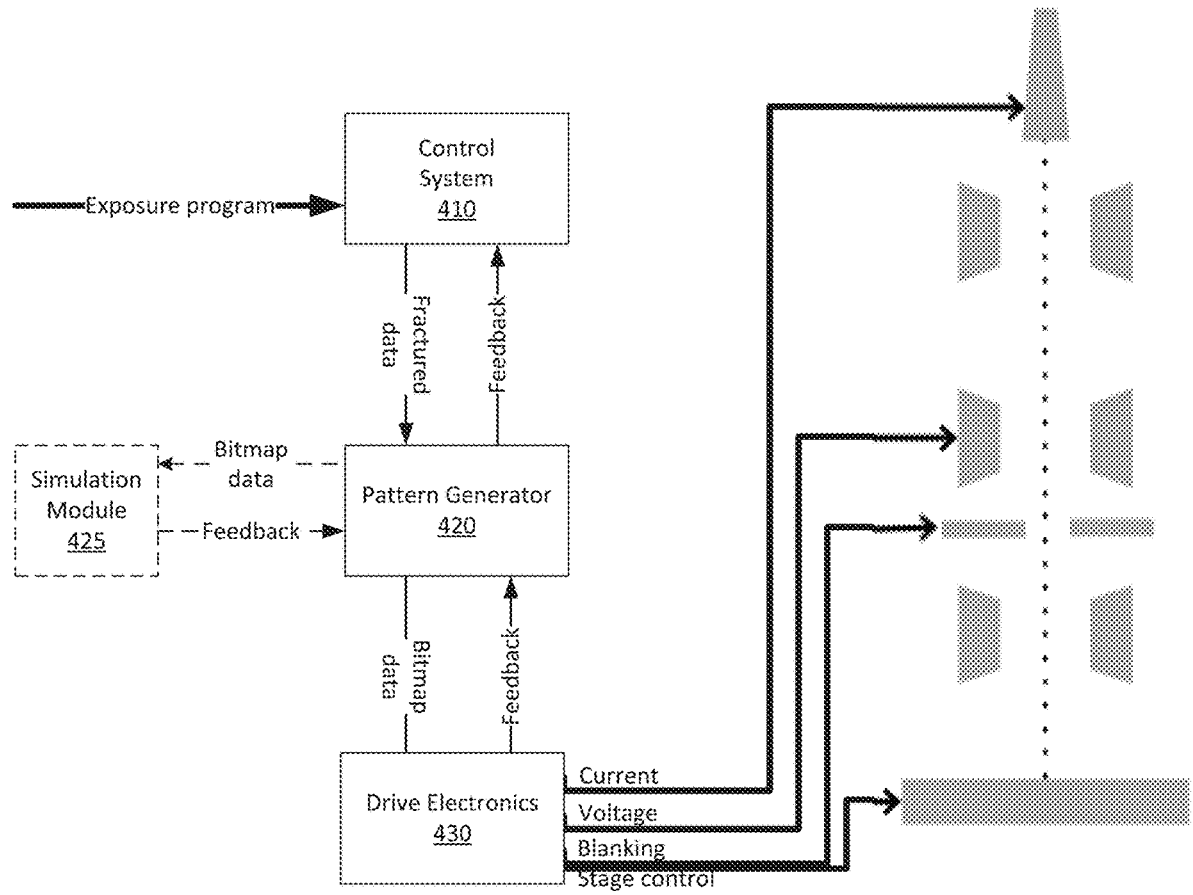
FIG. 4B is a block diagram illustrating an example configuration of a PEBL system in which the user-provided oracle function resides on a control system (e.g., a control computer).

FIG. 4B is a block diagram illustrating an example configuration of a PEBL system in which the user-provided oracle function resides on a control system 410 (e.g., a control computer). In this example, the pattern generator 420 may implement the oracle function (e.g., associated with a specific pattern) interfaces bidirectionally with a control system 410 to provide feedback on the current locations being addressed by the electron beam. The control system 410 may invoke the oracle to query the pattern at individual point locations (e.g., individual x,y locations), and/or it may query the pattern over an area corresponding to the current field being addressed by the beam and stage positioner, for example. Advantageously, while this PEBL configuration manages control and pattern generation, the low-level drive electronics and beam column may remain unchanged, allowing it to leverage existing EBL technologies.

Backwards Compatibility

Advantageously, the PEBL configuration, such as the example in 4B, is compatible with comprehensive layout files (e.g., in the form of a GDS file). For example, the oracle function (e.g., provided by the control system 410 and pattern generator 420) may be configured to read the layout file and render the portion that is required within the current write field.

Synchronization and Buffering

In some embodiments, the user-defined oracle may be of arbitrary complexity, and so on-the-fly data generation may stall the data pipeline and starve the low-level drive system of data. This could result in a loss of throughput and increased write times. Thus, in some embodiments the PEBL system may include a simulation module 425 (illustrated in FIG. 4B as an optional component of the PEBL system) that simulates portions of or the entire pattern generation process through invoking the oracle as needed, to determine the length of time required to write the entire pattern, e.g., including any time gaps where new output data to the drive electronics is not available. For example, the simulation module 425 may be coupled to the pattern generator and communicate with the pattern generator 420 during the simulation, rather than the pattern generator communicating with the drive electronics 430. Once a simulation is successfully performed (e.g., no gaps between output data from the pattern generator), the pattern generation may be performed again with the pattern generator outputting control signals to the drive electronics 430.

In some embodiments, such as where there are lengthy oracle calculations, the simulation module 425 may buffer results, such as in a similar manner as the drive electronics 430. This buffering requires additional memory in the control system (e.g., in the simulation module), but the amount is typically many orders of magnitude less than what would be required to store the entire pattern at once. In some implementations, buffering can be implemented using a hybrid approach between fully fracturing a layout before writing, and fracturing each field on the fly. For example, the simulation module 425 may buffer portions of the layout that are output from the pattern generator and feed those control signals to the drive electronics as necessary to keep the electronics from stalling.

Vectorial Scan Mode

Similar to operation in the raster scan mode discussed above, the data file of the full pattern is not generated all at once, but individual fields are generated on-the-fly by a script. In some implementations, a vector scan mode may be selected (e.g., automatically by the system or manually by a user input) for situations where more intelligent scanning conformally within the boundaries of exposure regions, which may lead to better sidewall smoothness and typically better writing times, is desired. Vector scan mode may require more precomputation than raster mode, such as for generation of the vector paths.

Figure 5:
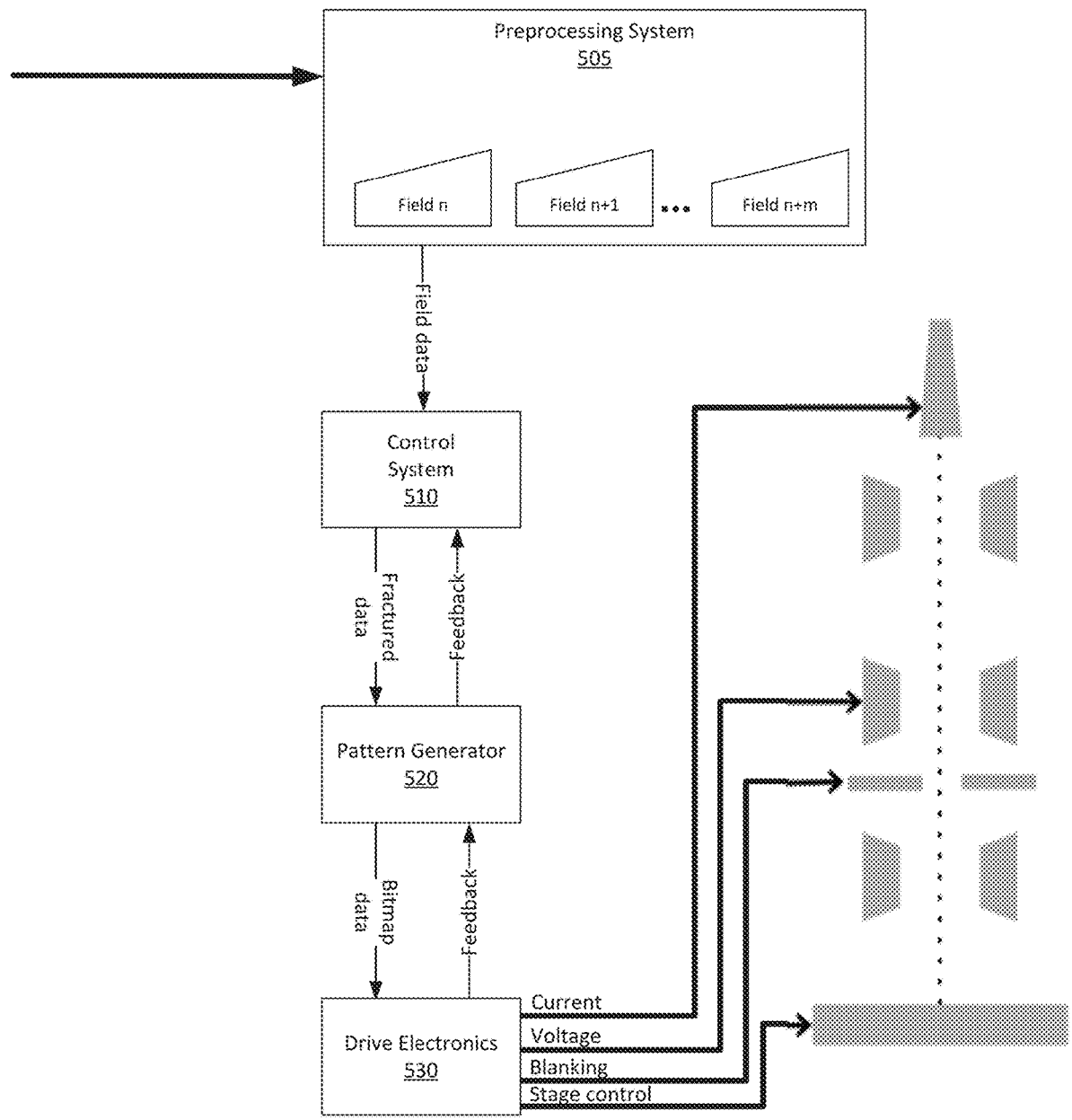
FIG. 5 is a block diagram illustrating an example configuration of a vectorial scan PEBL implementation.

FIG. 5 is a block diagram illustrating an example configuration of a vectorial scan PEBL implementation. In this embodiment, a preprocessing system 505 is configured to generate an exposure program for individual fields. For example, the preprocessing system 505 may be configured to concurrently generate an exposure program for more than one field, such as a field n (e.g., a current field), field n+1 (a next field), and any other number of fields (e.g., field n+m where m is the number of concurrently processed fields). In some embodiments, each field is fractured into basic shapes (e.g., trapezoids and rectangles) and the preprocessing system 505 converts the field data into an EBL machine input. The field data (e.g., for field n in the example of FIG. 5) is transmitted from the preprocessing system 505 to the control system 510, and the next field (e.g., field n+1) is generated while the control system 510, pattern generator 520, and/or drive electronics 530 move the stage to the field coordinates, generate the raster pattern, apply the subfield corrections and write the shape in field n. This process then repeats with subsequent fields, with the exposure program for one or more next fields being generated as a current field is processed by the control system 510, pattern generator 520, and/or drive electronics 530. In some embodiments, the preprocessing system may generate several fields prior to starting the scan (e.g., prior to providing field n exposure program to the control system 510). For example, the preprocessing system may be configured to automatically detect a complexity of the pattern and, based on the complexity, determine an appropriate cache of fields to calculate prior to starting the scan.

In some embodiments, for the current field being processed by the preprocessing system 505 (e.g., field n), the stage is moved to the corresponding location on the substrate(s) and for each elemental shape, a raster pattern is generated with subfield corrections applied. While the field is written, the next field (e.g., field n+1) is generated, such as by fracturing the shapes into trapezoids and rectangles, converting into EBL machine input, and transferring the file to the control system. Thus, the tasks of writing fields with the EBL and preprocessing another field (before it is sent to be written) can be pipelined (e.g., at least partially concurrently performed). That is, while field n is being written, field n+1 is being preprocessed. Next, field n+1 will be written, and field n+2 can be preprocessed, and so on.

Proximity Effects

In some embodiments, the entire pattern layout is not known at one time and, thus, corrections for proximity effects may not be applied a priori. Thus, in implementations where proximity effect corrections are desired, local neighborhoods of pattern data may be generated prior to outputting to the drive electronics. For example, instead of generating one field of data at a time (e.g., in the vector mode of FIG. 5), a 3×3 grid of fields may be maintained so that proximity corrections may be applied to one or more of the fields (e.g., the central field with adjacent fields generated in each direction).

Example Patterns

Figure 6A:
FIG. 6A is an example approximation of a pattern with approximately linear strips.

As an example of patterns that may be generated in real-time using the PEBL architecture discussed herein, consider a diffractive optical element (DOE) that works in 1st order and imparts a phase function F(x, y). The resulting pattern to be written corresponds to the regions in which $$\mathrm{frac}\{[G+g \text{ rad } F(x,y)]\cdot(x,y)\} < 0.5$$

where G is a constant grating vector corresponding to the base diffraction grating, grad F(x,y) is the gradient vector of the phase function, the period '.' represents a 2D dot product, and frac{ } represents taking the fractional part of the result (a value that is always between 0 and 1). In this example, given any coordinate (x,y), whether or not the pattern should be written to can be determined by evaluating the above inequality. This case results in a pattern that is a sequence of approximately linear stripes. This pattern representation using, e.g., a GDS file, may be tractable. FIG. 6A is an example approximation of this pattern.

Figure 6B:
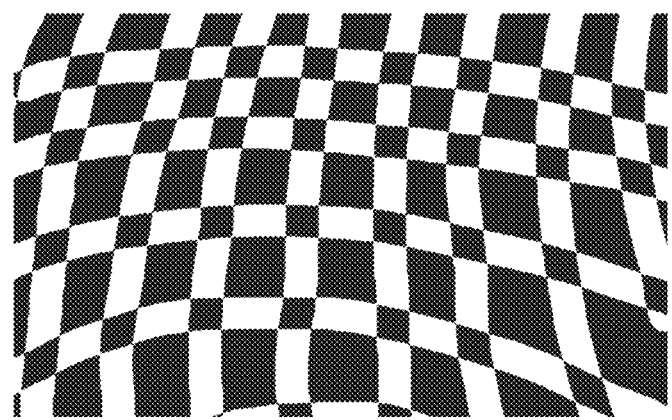
FIG. 6B is an example approximation of a non-periodic checkerboard pattern.

As another example, consider a pattern that include two such DOEs multiplexed together in nearly orthogonal directions. In this case, the XOR of the two stripe-like patterns may produce a pattern including islands similar to a checkerboard pattern, but nowhere periodic (see, e.g., FIG. 6B, which is an example approximation of such a pattern). Attempting to represent such a pattern using a GDS file, for example, may be intractable over large areas. For example, in a GDS file each quadrangular region may be represented by a polygon. For diffractive structures, each polygon may have dimensions smaller than the wavelength of light (e.g., for visible light, these sizes may be in the range of 10-1000 nanometers). For large area diffractive optical elements, say on eyeglasses, the overall dimension might be on the scale of centimeters. Thus, taking 100 nm as the polygon size, then a 1 cm patch of diffractive optics would require 10 billion polygons, which a GDS file would have a size on the order of 2 terabytes. This is an impractically large amount of data for a modestly sized optic.

Additional Considerations

Each of the processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, animations or video may include many frames, with each frame having millions of pixels, and specifically programmed computer hardware is necessary to process the video data to provide a desired image processing task or application in a commercially reasonable amount of time.

Various embodiments of the present disclosure may be a system, a method, and/or a computer program product at any possible technical detail level of integration. The computer program product may include a computer readable storage medium (or mediums) having computer readable program instructions thereon for causing a processor to carry out aspects of the present disclosure.

For example, the functionality described herein may be performed as software instructions are executed by, and/or in response to software instructions being executed by, one or more hardware processors and/or any other suitable computing devices. The software instructions and/or other executable code may be read from a computer readable storage medium (or mediums).

The computer readable storage medium can be a tangible device that can retain and store data and/or instructions for use by an instruction execution device. The computer readable storage medium may be, for example, but is not limited to, an electronic storage device (including any volatile and/or non-volatile electronic storage devices), a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a solid state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions (as also referred to herein as, for example, "code," "instructions," "module," "application," "software application," and/or the like) for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, C++, or the like, and procedural programming languages, such as the "C" programming language or similar programming languages. Computer readable program instructions may be callable from other instructions or from itself, and/or may be invoked in response to detected events or interrupts. Computer readable program instructions configured for execution on computing devices may be provided on a computer readable storage medium, and/or as a digital download (and may be originally stored in a compressed or installable format that requires installation, decompression or decryption prior to execution) that may then be stored on a computer readable storage medium. Such computer readable program instructions may be stored, partially or fully, on a memory device (e.g., a computer readable storage medium) of the executing computing device, for execution by the computing device. The computer readable program instructions may execute entirely on a user's computer (e.g., the executing computing device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart(s) and/or block diagram(s) block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. For example, the instructions may initially be carried on a magnetic disk or solid state drive of a remote computer. The remote computer may load the instructions and/or modules into its dynamic memory and send the instructions over a telephone, cable, or optical line using a modem. A modem local to a server computing system may receive the data on the telephone/cable/optical line and use a converter device including the appropriate circuitry to place the data on a bus. The bus may carry the data to a memory, from which a processor may retrieve and execute the instructions. The instructions received by the memory may optionally be stored on a storage device (e.g., a solid state drive) either before or after execution by the computer processor.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. In addition, certain blocks may be omitted in some implementations. The methods and processes described herein are also not limited to any particular sequence, and the blocks or states relating thereto can be performed in other sequences that are appropriate.

It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. For example, any of the processes, methods, algorithms, elements, blocks, applications, or other functionality (or portions of functionality) described in the preceding sections may be embodied in, and/or fully or partially automated via, electronic hardware such application-specific processors (e.g., application-specific integrated circuits (ASICs)), programmable processors (e.g., field programmable gate arrays (FPGAs)), application-specific circuitry, and/or the like (any of which may also combine custom hard-wired logic, logic circuits, ASICs, FPGAs, etc. with custom programming/execution of software instructions to accomplish the techniques).

Any of the above-mentioned processors, and/or devices incorporating any of the above-mentioned processors, may be referred to herein as, for example, "computers," "computer devices," "computing devices," "hardware computing devices," "hardware processors," "processing units," and/or the like. Computing devices of the above-embodiments may generally (but not necessarily) be controlled and/or coordinated by operating system software, such as Mac OS, iOS, Android, Chrome OS, Windows OS (e.g., Windows XP, Windows Vista, Windows 7, Windows 8, Windows 10, Windows Server, etc.), Windows CE, Unix, Linux, SunOS, Solaris, Blackberry OS, VxWorks, or other suitable operating systems. In other embodiments, the computing devices may be controlled by a proprietary operating system. Conventional operating systems control and schedule computer processes for execution, perform memory management, provide file system, networking, I/O services, and provide a user interface functionality, such as a graphical user interface ("GUI"), among other things.

As described above, in various embodiments certain functionality may be accessible by a user through a web-based viewer (such as a web browser), or other suitable software program). In such implementations, the user interface may be generated by a server computing system and transmitted to a web browser of the user (e.g., running on the user's computing system). Alternatively, data (e.g., user interface data) necessary for generating the user interface may be provided by the server computing system to the browser, where the user interface may be generated (e.g., the user interface data may be executed by a browser accessing a web service and may be configured to render the user interfaces based on the user interface data). The user may then interact with the user interface through the web-browser. User interfaces of certain implementations may be accessible through one or more dedicated software applications. In certain embodiments, one or more of the computing devices and/or systems of the disclosure may include mobile computing devices, and user interfaces may be accessible through such mobile computing devices (for example, smartphones and/or tablets).

These computer programs, which may also be referred to as programs, software, software applications, applications, components, or code, may include machine instructions for a programmable controller, processor, microprocessor or other computing or computerized architecture, and may be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium may store such machine instructions non-transitorily, such as for example as would a non-transient solid-state memory or a magnetic hard drive or any equivalent storage medium. The machine-readable medium may alternatively or additionally store such machine instructions in a transient manner, such as for example as would a processor cache or other random access memory associated with one or more physical processor cores.

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The term "substantially" when used in conjunction with the term "real-time" forms a phrase that will be readily understood by a person of ordinary skill in the art. For example, it is readily understood that such language will include speeds in which no or little delay or waiting is discernible, or where such delay is sufficiently short so as not to be disruptive, irritating, or otherwise vexing to a user.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

Spatially relative terms, such as "forward", "rearward", "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features due to the inverted state. Thus, the term "under" may encompass both an orientation of over and under, depending on the point of reference or orientation. The device may be otherwise oriented (rotated 90 degrees or at other orientations) and the spatially relative descriptors used herein interpreted accordingly. Similarly, the terms "upwardly", "downwardly", "vertical", "horizontal" and the like may be used herein for the purpose of explanation only unless specifically indicated otherwise.

Although the terms "first" and "second" may be used herein to describe various features/elements (including steps or processes), these features/elements should not be limited by these terms as an indication of the order of the features/elements or whether one is primary or more important than the other, unless the context indicates otherwise. These terms may be used to distinguish one feature/element from another feature/element. Thus, a first feature/element discussed could be termed a second feature/element, and similarly, a second feature/element discussed below could be termed a first feature/element without departing from the teachings provided herein.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise.

For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, may represent endpoints or starting points, and ranges for any combination of the data points. For example, if a particular data point "10" and a particular data point "15" may be disclosed, it is understood that greater than, greater than or equal to, less than, less than or equal to, and equal to 10 and 15 may be considered disclosed as well as between 10 and 15. It is also understood that each unit between two particular units may be also disclosed. For example, if 10 and 15 may be disclosed, then 11, 12, 13, and 14 may be also disclosed.

Although various illustrative embodiments have been disclosed, any of a number of changes may be made to various embodiments without departing from the teachings herein. For example, the order in which various described method steps are performed may be changed or reconfigured in different or alternative embodiments, and in other embodiments one or more method steps may be skipped altogether. Optional or desirable features of various device and system embodiments may be included in some embodiments and not in others. Therefore, the foregoing description is provided primarily for the purpose of example and should not be interpreted to limit the scope of the claims and specific embodiments or particular details or features disclosed.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A computer system comprising:
a non-transitory computer readable storage device storing an oracle function associated with a pattern to be produced on a substrate, wherein the oracle function is executable to receive as an input coordinates of the substrate and to provide an output including control data comprising exposure settings usable by an electron beam lithography (EBL) system at the coordinates of the substrate to provide on-the-fly exposure settings usable by the electronic beam lithography (EBL) system to produce the pattern;
a control system having one or more hardware computer processors, the control system configured to, for each of a plurality of fields of the pattern to be produced on the substrate:
for each of a plurality of coordinates of the substrate:
determine coordinates of the substrate;
call the oracle function using the determined coordinates of the substrate;
receive, from the oracle function, control data comprising exposure settings, which is configured to control operation of an electron beam lithography (EBL) system;
transmit the control data to EBL drive electronics; and
EBL drive electronics configured to:
receive the control data;
determine one or more of a current, voltage, blanking, or stage control of the electronic beam lithography based on the control data.

2. The computing system of claim 1, wherein the control system is further configured to:
generate fractured data representative of the pattern.

3. The computing system of claim 2, wherein the fractured data includes a plurality of fields of the pattern.

4. The computing system of claim 1, wherein the drive electronics is further configured to:

transmit feedback to the control system indicative of status of operation of an electron beam lithography (EBL) system controlled by the control data.

5. The computing system of claim 1, wherein the control system selects a next coordinate of the substrate in response to feedback from the drive electronics.

6. The computing system of claim 1, further comprising: a simulation module configured to generate simulated control data to simulate at least a portion of a process of generating the pattern.

7. The computing system of claim 6, wherein the simulation module is configured to:
for each of a plurality of coordinates of the substrate:
determine coordinates of the substrate;
call the oracle function using the determined coordinates of the substrate;
receive, from the oracle function, control data configured to control operation of an electron beam lithography (EBL) system; and
simulate at least a portion of the process of generating the pattern with the received control data.

8. The computing system of claim 7, wherein the simulation module is further configured to provide simulation feedback to the control system.

9. A computerized method, performed by a computing system having one or more hardware computer processors and one or more non-transitory computer readable storage device storing software instructions executable by the computing system to perform the computerized method comprising:
dividing a pattern to be generated on a substrate into a plurality of fields;
for each of the plurality of fields:
determine coordinates of the substrate;
evaluate an oracle function using the determined coordinates of the substrate to generate fractured data, wherein the oracle function is a user-designed function configured to provide on-the-fly control data comprising exposure settings usable by an electronic beam lithography (EBL) system to produce the pattern;
based at least on the fractured data, generate the on-the-fly control data comprising exposure settings, which is configured to control operation of the electronic beam lithography (EBL) system to produce the pattern, the control data indicative of one or more of a current, a voltage, a blanking, or a stage control of the EBL at the current field; and
transmit the control data to the EBL system.

10. The computerized method of claim 9, wherein control data of a next field of the plurality of fields is generated while the EBL system executes the control data at the current field.

11. The computerized method of claim 9, wherein the control data is temporarily cached until control data for one or more additional fields is generated.

12. The computerized method of claim 11, wherein a quantity of the one or more additional fields is determined based on a complexity of the pattern, wherein a more complex pattern is associated with a higher quantity and a less complex pattern is associated with a lower quantity.

13. The computerized method of claim 9, wherein the control data for two or more fields is concurrently generated.

* * * * *